United States Patent
Dogiamis et al.

(10) Patent No.: US 10,593,636 B2
(45) Date of Patent: *Mar. 17, 2020

(54) PLATFORM WITH THERMALLY STABLE WIRELESS INTERCONNECTS

(71) Applicant: Intel Corporation, Santa Clara, CA (US)

(72) Inventors: Georgios C. Dogiamis, Chandler, AZ (US); Sasha N. Oster, Marion, IA (US); Telesphor Kamgaing, Chandler, AZ (US); Adel A. Elsherbini, Chandler, AZ (US); Brandon M. Rawlings, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/127,820

(22) Filed: Sep. 11, 2018

(65) Prior Publication Data
US 2019/0006298 A1    Jan. 3, 2019

Related U.S. Application Data

(63) Continuation of application No. 14/860,614, filed on Sep. 21, 2015, now Pat. No. 10,083,923.

(51) Int. Cl.
*H01L 23/36*    (2006.01)
*H01L 23/66*    (2006.01)
(Continued)

(52) U.S. Cl.
CPC .......... *H01L 23/66* (2013.01); *H01L 23/3675* (2013.01); *H01L 23/49827* (2013.01);
(Continued)

(58) Field of Classification Search
CPC ........ H01L 2223/6677; H01L 25/0655; H01L 25/0652; H01L 23/367–3677
See application file for complete search history.

(56) References Cited

U.S. PATENT DOCUMENTS 5,933,324 A    8/1999 Barrett
6,519,154 B1   2/2003 Chiu
(Continued)

OTHER PUBLICATIONS

International Preliminary Report on Patentability for PCT/US2016/043583, dated Apr. 5, 2018, 11 pages.
(Continued)

*Primary Examiner* — Didarul A Mazumder
(74) *Attorney, Agent, or Firm* — Schwabe, Williamson & Wyatt, P.C.

(57) ABSTRACT

Embodiments of the invention may include a packaged device that includes thermally stable radio frequency integrated circuits (RFICs). In one embodiment the packaged device may include an integrated circuit chip mounted to a package substrate. According to an embodiment, the package substrate may have conductive lines that communicatively couple the integrated circuit chip to one or more external components. One of the external components may be an RFIC module. The RFIC module may comprise an RFIC and an antenna. Additional embodiments may also include a packaged device that includes a plurality of cooling spots formed into the package substrate. In an embodiment the cooling spots may be formed proximate to interconnect lines the communicatively couple the integrated circuit chip to the RFIC.

20 Claims, 8 Drawing Sheets

(51) Int. Cl.
  *H01L 23/498* (2006.01)
  *H01L 23/367* (2006.01)
  *H01L 23/538* (2006.01)
  *H01L 23/00* (2006.01)
  *H01L 25/065* (2006.01)

(52) U.S. Cl.
  CPC .... *H01L 23/49838* (2013.01); *H01L 23/5383* (2013.01); *H01L 23/367* (2013.01); *H01L 24/13* (2013.01); *H01L 24/16* (2013.01); *H01L 24/73* (2013.01); *H01L 25/0655* (2013.01); *H01L 2223/6627* (2013.01); *H01L 2223/6677* (2013.01); *H01L 2224/12105* (2013.01); *H01L 2224/131* (2013.01); *H01L 2224/16227* (2013.01); *H01L 2224/73253* (2013.01); *H01L 2924/014* (2013.01); *H01L 2924/1421* (2013.01); *H01L 2924/1432* (2013.01); *H01L 2924/1434* (2013.01); *H01L 2924/15192* (2013.01); *H01L 2924/15311* (2013.01); *H01L 2924/15313* (2013.01); *H01L 2924/15321* (2013.01); *H01L 2924/163* (2013.01); *H01L 2924/16251* (2013.01)

(56) References Cited

U.S. PATENT DOCUMENTS

| | | | |
|---|---|---|---|
| 7,667,974 | B2 * | 2/2010 | Nakatani .................. H05K 1/02 361/760 |
| 7,852,281 | B2 | 12/2010 | Choudhury |
| 2005/0134507 | A1 | 6/2005 | Dishongh et al. |
| 2006/0276157 | A1 | 12/2006 | Chen et al. |
| 2007/0246545 | A1 | 10/2007 | Wang |
| 2009/0091904 | A1 | 4/2009 | Hatanaka et al. |
| 2012/0063094 | A1 | 3/2012 | Gaynes et al. |
| 2012/0235881 | A1 | 9/2012 | Pan et al. |
| 2014/0028518 | A1 | 1/2014 | Arnold et al. |
| 2014/0264339 | A1 | 9/2014 | Kim et al. |
| 2015/0181739 | A1 | 6/2015 | Fukuda et al. |

OTHER PUBLICATIONS

International Search Report and Written Opinion from PCT/US2016/043583 dated Oct. 27, 2016, 12 pgs.

\* cited by examiner

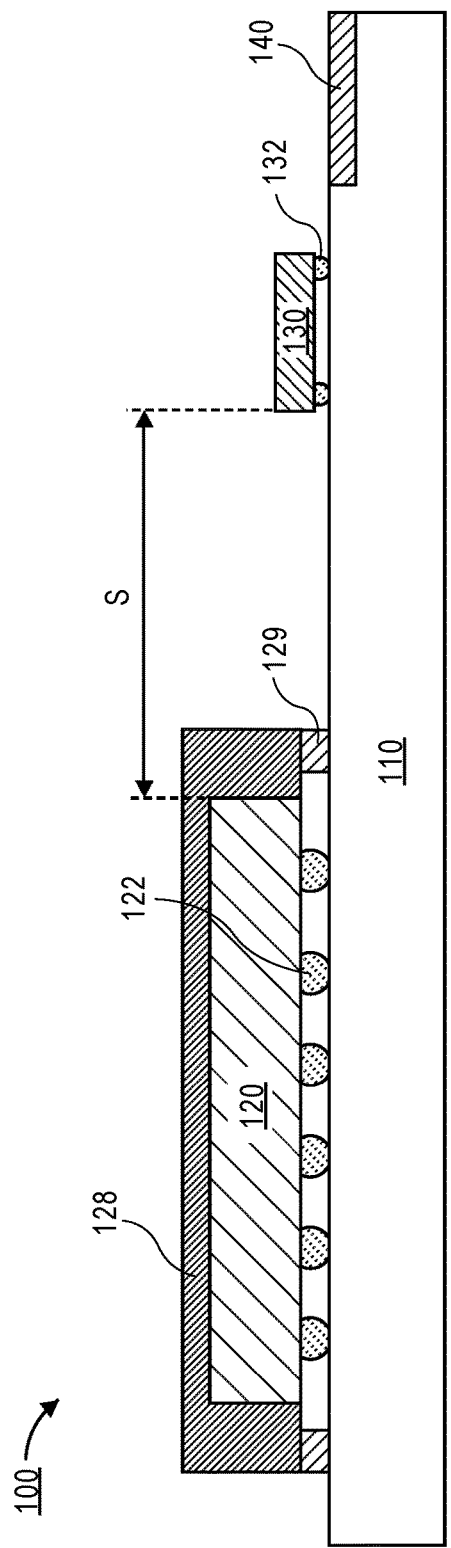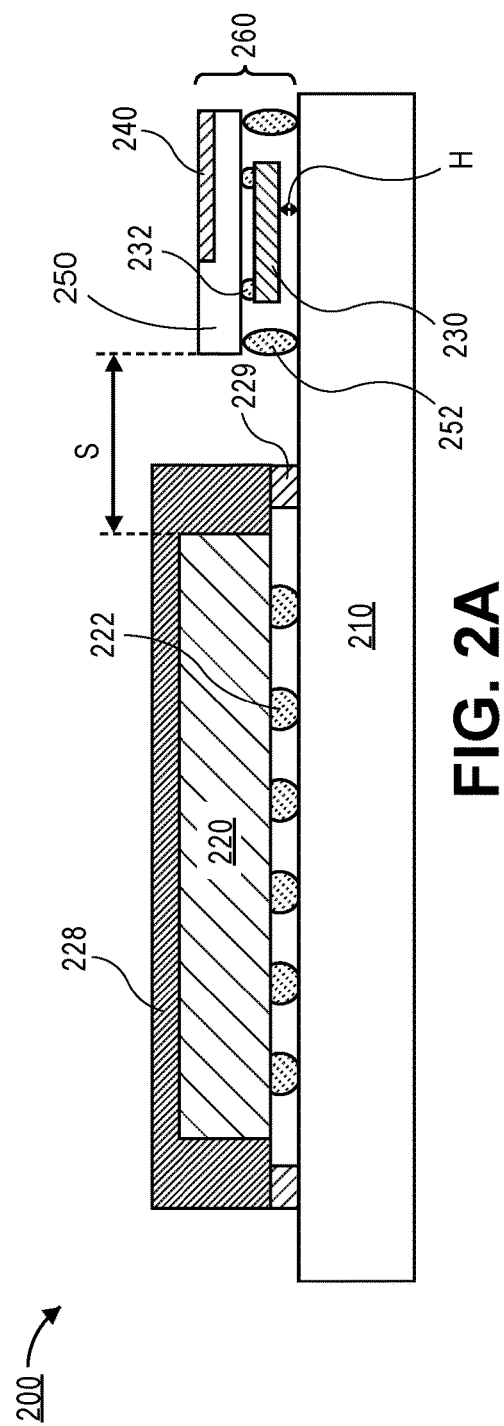

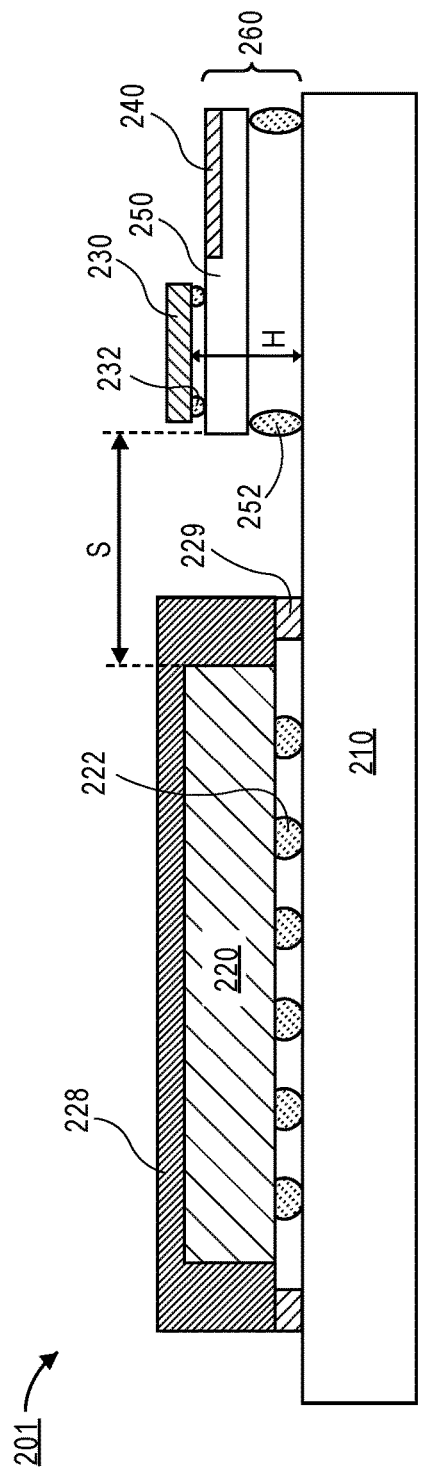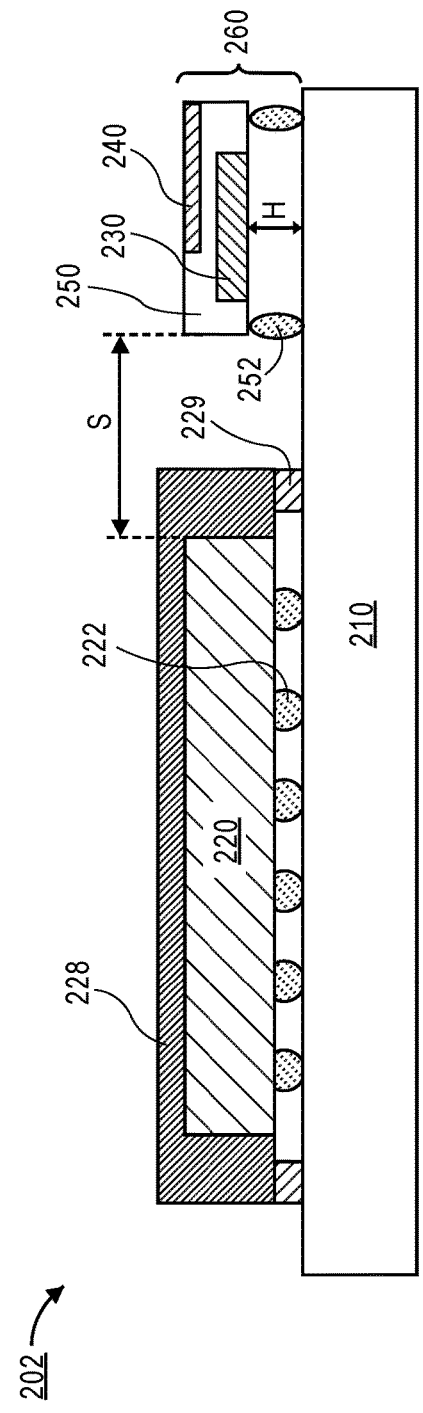
FIG. 2B
FIG. 2C

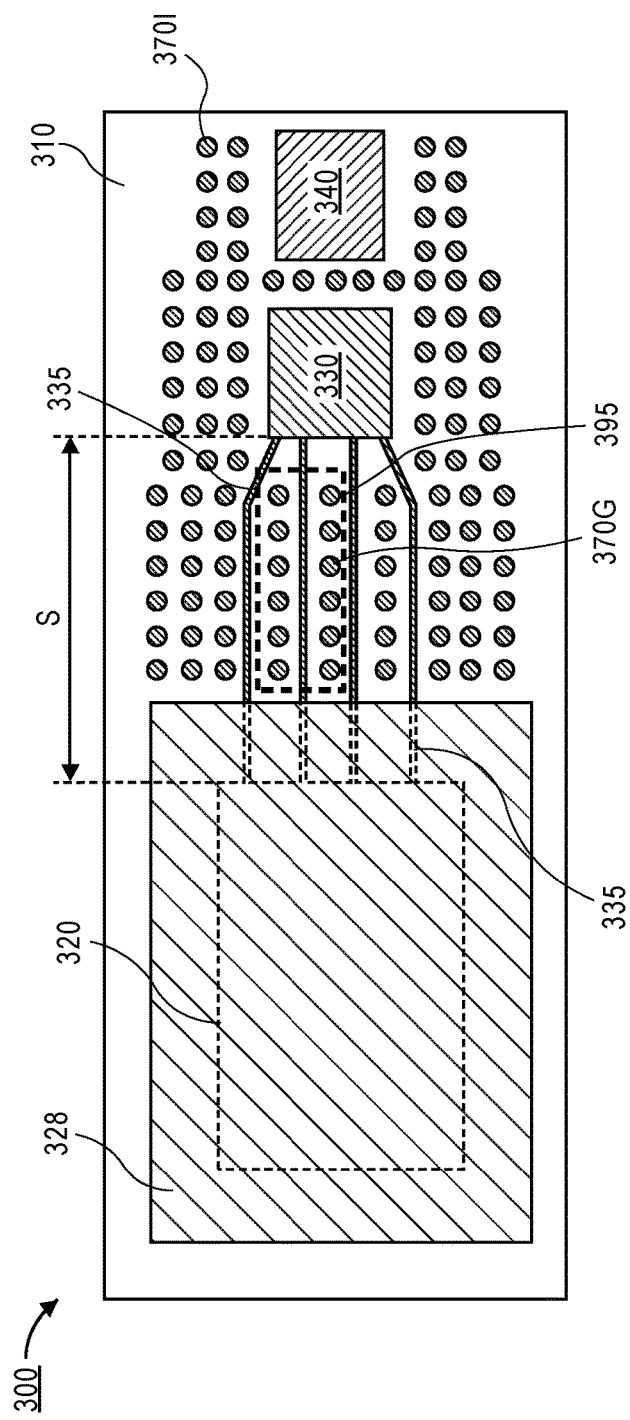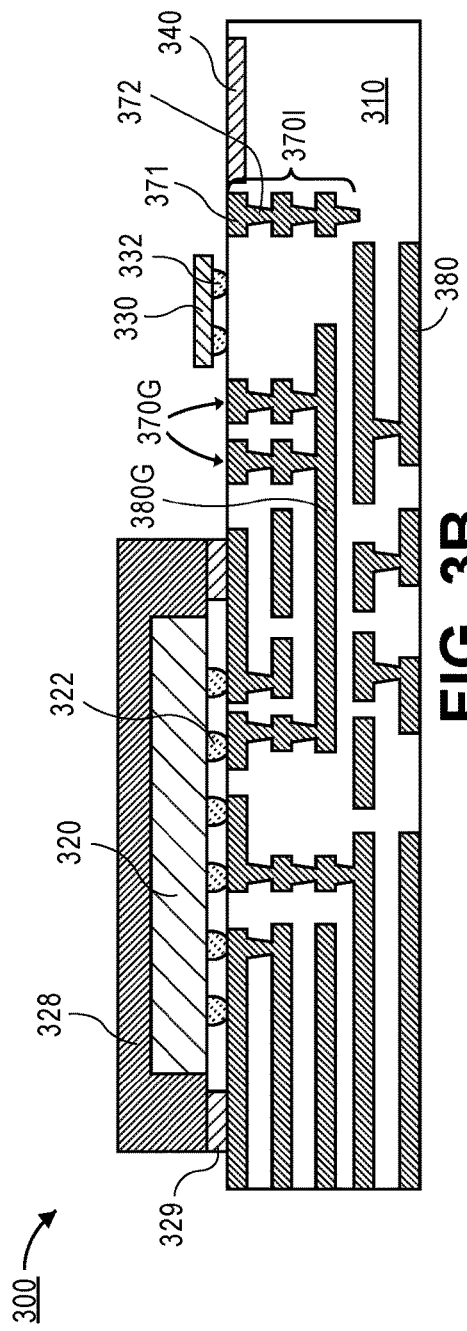

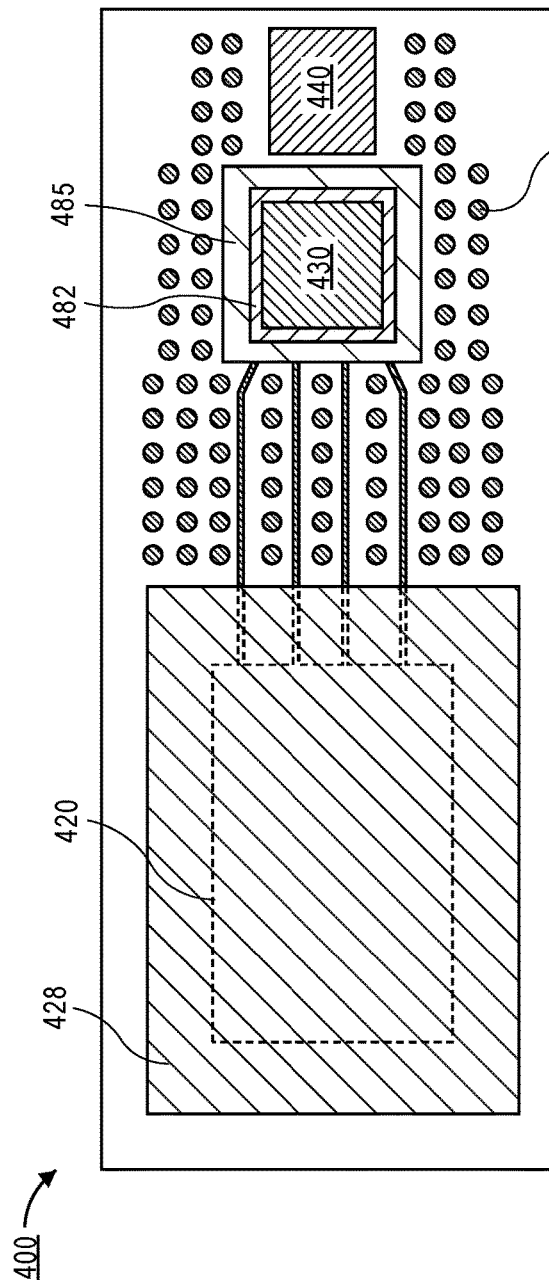
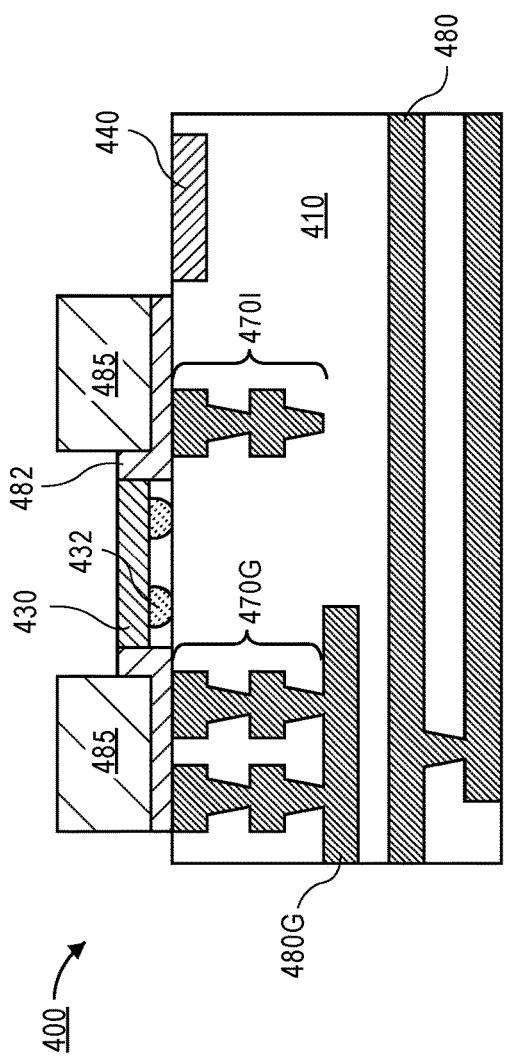
FIG. 4A
FIG. 4B

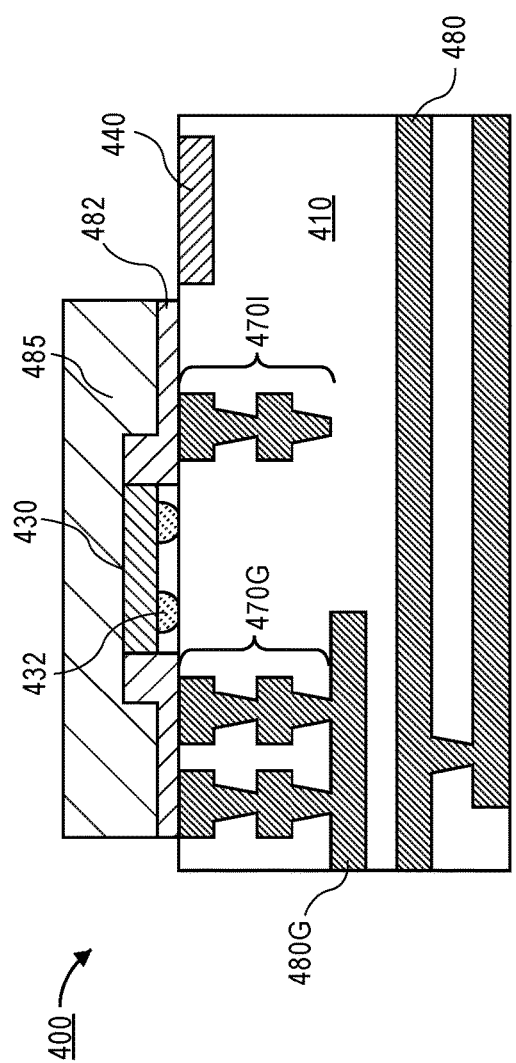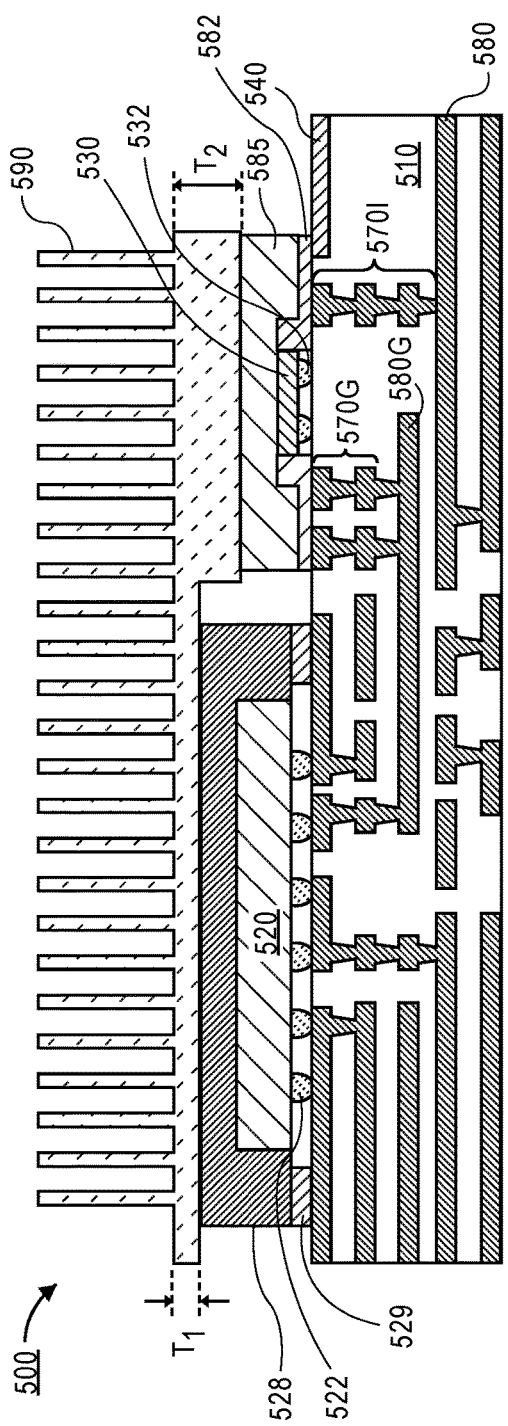

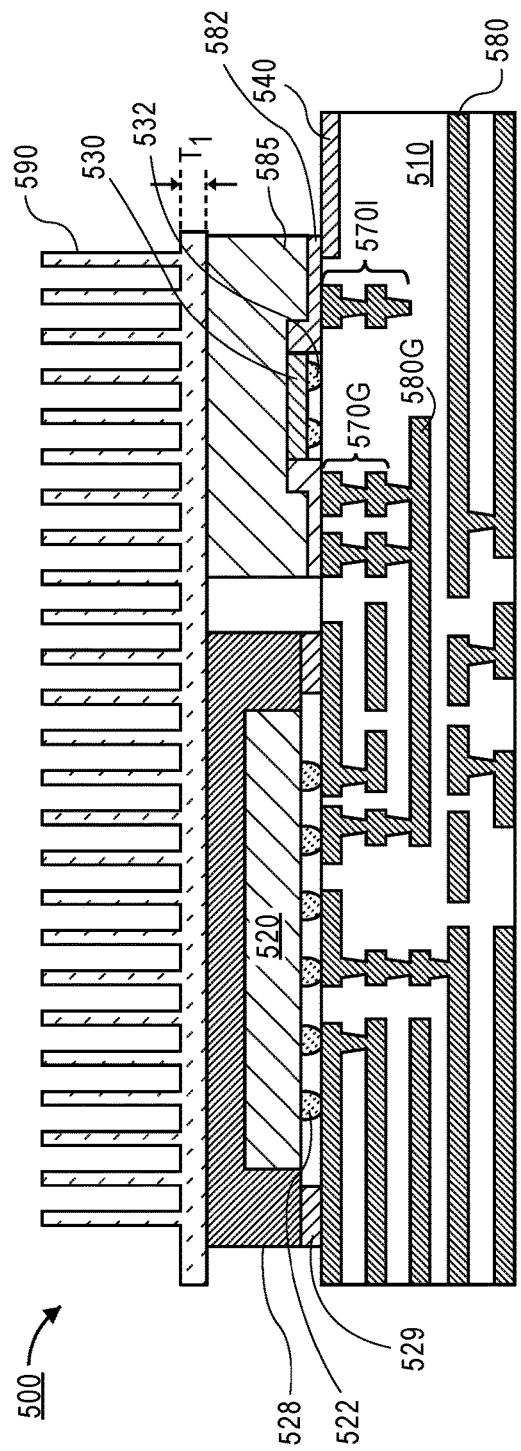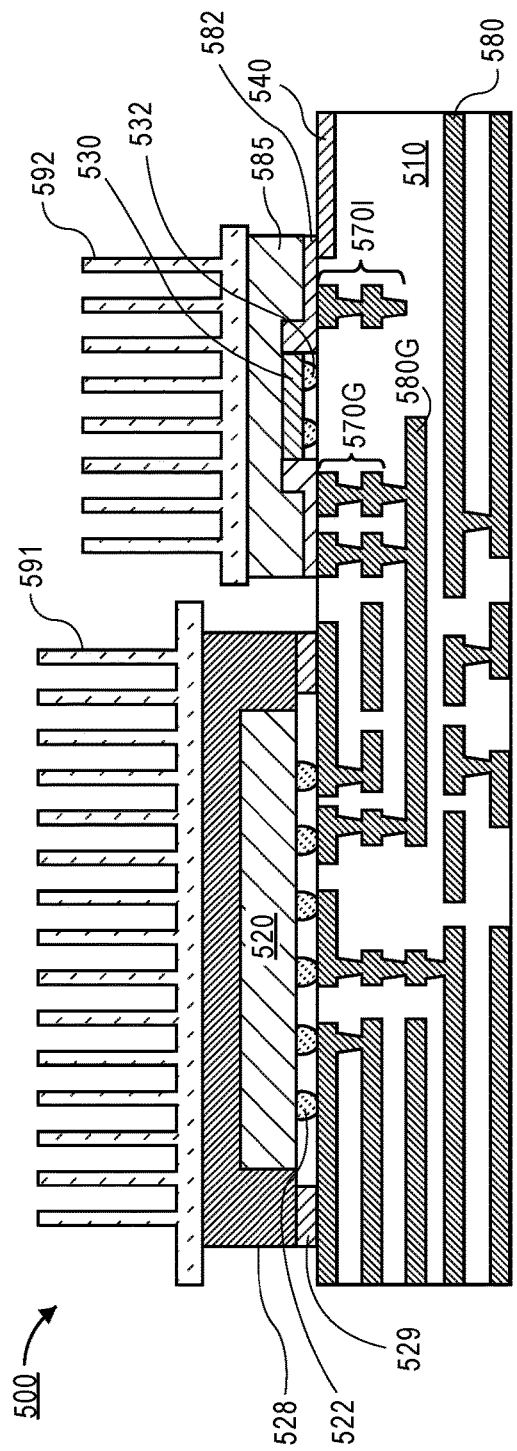

PLATFORM WITH THERMALLY STABLE WIRELESS INTERCONNECTS

CROSS-REFERENCE TO RELATED APPLICATIONS

This application is a continuation of U.S. patent application Ser. No. 14/860,614, filed on Sep. 21, 2015, the entire contents of which is hereby incorporated by reference herein.

FIELD OF THE INVENTION

Embodiments generally relate to semiconductor devices. More specifically, embodiments relate to packaging solutions for wireless radio frequency (RF) interconnects.

BACKGROUND OF THE INVENTION

The drive to increase data transfer speeds and include high-bandwidth channels in server platforms has presented several challenges. For example the thermal specifications of such server platforms are growing increasingly stringent due to the increased power dissipation. Approximately 80% of the thermal power from the central processing unit (CPU) in such server platforms may be dissipated through an integrated heat spreader (IHS) that is formed over the CPU. The dissipation of the thermal power through the IHS may result in the operating temperature of the IHS to be between approximately 70° C. and 100° C. under standard operating conditions. The remaining thermal power is dissipated through the package on which the CPU is mounted. Accordingly, the temperature increase of the package may be significant even when an IHS is used.

Increases in the temperature of the package can cause several issues. For example, future server or microserver architectures may include radio frequency integrated circuits (RFICs) for wireless interconnects that are mounted on the same package as the CPU. However, RFICs are temperature-sensitive. The sensitivity to temperature causes the radio output power of the RFICs to drift with the temperature. As such, increases in the temperature of the package due to the thermal dissipation from the CPU will result in changes to the radio output power.

Current solutions for dealing with the increased temperature of the package have significant drawbacks. A first proposed solution to the problem is to increase the distance between the RFIC and the CPU. Spacing the two components further from each other reduces the amount of heat that is dissipated from the CPU to the RFIC through the package substrate. However, the increased spacing between the components necessitates the use of more real estate on the package, and therefore, increases the cost. An additional solution would allow for reduced real estate utilization, but would require temperature sensing capabilities on the RFIC in addition to the use of on-the-fly calibration techniques within the RFIC. These additions would increase the complexity of the RFIC and result in an increased power dissipation as well. Accordingly, there is a need for additional ways to control the temperature of a package that includes RFICs.

BRIEF DESCRIPTION OF THE DRAWINGS

FIG. 1B is a cross-sectional illustration of a processing unit, an RFIC, and an antenna that are coupled to a substrate, according to an embodiment of the invention.

FIG. 2A is a cross-sectional illustration of a processing unit and an RFIC module coupled to the same substrate, wherein the RFIC module includes an RFIC coupled to a first surface of the module and an antenna, according to an embodiment of the invention.

FIG. 2B is a cross-sectional illustration of a processing unit and an RFIC module coupled to the same substrate, wherein the RFIC module includes an RFIC coupled to a second surface of the module and an antenna, according to an embodiment of the invention.

FIG. 2C is a cross-sectional illustration of a processing unit and an RFIC module coupled to the same substrate, wherein the RFIC module includes an RFIC embedded in the substrate of the RFIC module and an antenna, according to an embodiment of the invention.

FIG. 3A is a plan view illustration of a substrate that includes a processing unit, an RFIC, an antenna, and a plurality of cooling spots, according to an embodiment of the invention.

FIG. 3B is a cross-sectional illustration of the device in FIG. 3A, according to an embodiment of the invention.

FIG. 4A is a plan view illustration of a substrate that includes a processing unit, an RFIC, an IHS formed over the RFIC, an antenna, and a plurality of cooling spots, according to an embodiment of the invention.

FIG. 4B is a cross-sectional illustration of the device in FIG. 4A, according to an embodiment of the invention.

FIG. 4C is a cross-sectional illustration of the device with the IHS covering a top surface of the RFIC, according to an embodiment of the invention.

FIG. 5A is a cross-sectional illustration of a server platform substrate that includes a heat sink, according to an embodiment of the invention.

FIG. 5B is a cross-sectional illustration of a server platform substrate that includes a heat sink, according to an additional embodiment of the invention.

FIG. 5C is a cross-sectional illustration of a server platform substrate that includes more than one heat sink, according to an additional embodiment of the invention.

DETAILED DESCRIPTION OF THE INVENTION

Described herein are systems that include thermally stable radio frequency integrated circuits for wireless interconnects. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
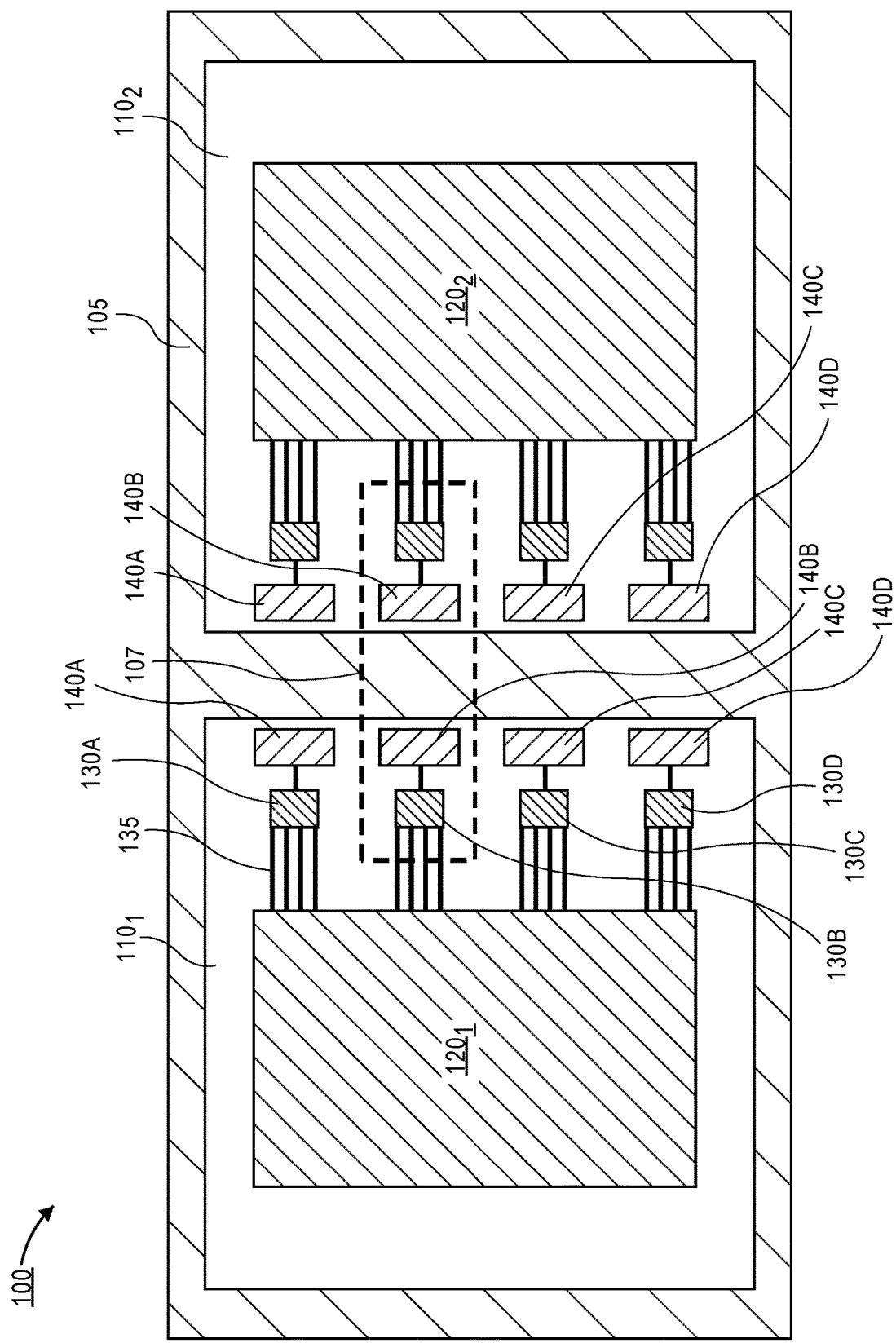
FIG. 1A is a plan view illustration of a server platform that utilizes wireless interconnects, according to an embodiment of the invention.

Referring now to FIG. 1A, an overhead plan view of a server platform 100 is illustrated. In the illustrated embodiment, a first 1101 and second 1102 package substrate are mounted to a printed circuit board (PCB) 105, such as a motherboard, system or logic board or daughter card using a solder ball array or any other desired system. A first processing unit 1201 and a second processing unit 1202 are each mounted to a respective package substrates 1101, 1102 using a ball grid array (BGA), land grid array (LGA), or other connection system including pads, wire leads, or other connectors. In an embodiment, the first and second package substrates 1101, 1102 may be electrically connected to external components, power, and any other desired devices through traces (not shown) on the PCB 105.

The first and second processing units 1201, 1202 are discussed herein as being central processing units (CPUs) and, in particular, as server CPUs. However, it is to be appreciated that the techniques and configurations described herein may be applied to many different types of devices for which a high speed communications link would be suitable. In some embodiments, the processing unit may include many different function such as with a SoC (System on a Chip). In other embodiments, the processing units may be memory, a communications interface hub, a storage device, co-processor or any other desired type of chip. In an additional embodiment, the two processing units may be different. For example, the first processing unit 1201 may be a CPU and the second processing unit 1202 may be a memory or a chipset. According to additional embodiments, the first package substrate 1101 and the second package substrate 1102 may be mounted on different motherboards 105. For example, in microservers two or more motherboards may face each other (e.g., like cards in slots). In such embodiments, wireless communication can be achieved between processing units 120 on neighboring motherboards 105. Additional embodiments may also use reflectors that allow for wireless communication between processing units 120 that are mounted on non-neighboring motherboards 105.

Each processing unit 120 may be communicatively coupled through the package to one or more radio frequency integrated circuits (RFICs) 130A-130D. For example, the processing units 120 in the illustrated embodiment are communicatively coupled to the RFICs 130 by conductive traces 135. In an embodiment, each of the RFICs 130 may be formed of a single die or a package with multiple dies or using another technique. According to an embodiment, the RFICs 130 may include dedicated transmit (TX) chains and receive (RX) chains for processing transmitted or received wireless communications. The TX chain may up-convert baseband signals from the processing unit 120 into a format that may be transmitted by the antenna 140, and the RX chain may down-convert signals received by the antenna 140 into a baseband signal that may be sent to the processing unit 110.

According to an embodiment, each of the RFICs 130A-D may be coupled to a corresponding antenna 140A-D. While four RFIC/antenna pairs are illustrated on each package substrate 110 in FIG. 1A, it is to be appreciated that each processing unit 120 may be coupled to one or more RFIC/antenna pairs, according to an embodiment. For example, embodiments of the invention may include a processing unit 120 that is communicatively coupled with approximately thirty or more RFIC/antenna pairs formed on the package substrate. Additional embodiments also include forming RFIC/antenna pairs along multiple edges of the package substrate 110 in order to allow for the processing unit 120 to communicate with multiple processing units formed on other packages that are positioned adjacent to different edges of the package 110.

Embodiments of the invention include antennas 140 that may be integrated onto and/or into the package substrate 110. The antennas 140 may be positioned so that when the first package substrate 1101 and the second package substrate 1102 are mounted to the motherboard 105, the corresponding antennas are directed to each other. For example, in the dashed box 107, antenna 140B on the first package substrate 1101 is directed at antenna 140B on the second package substrate 1102. In additional embodiments where the first and second package substrates 1101, 1102 are mounted on separate motherboards 105, the package substrates 1101, 1102 may still include antennas 140 that are communicatively coupled with each other. For example, the antennas 140 may be placed on package substrates that are mounted on different motherboards 105 that are facing each other, or reflectors may be used to communicatively couple antennas 140 that are formed on packages that are not facing each other. Additional embodiments may utilize beam steering techniques to allow antennas that are not lined up to send and receive information. For example, antenna 140C on the first package substrate 1101 may be able to send or receive wireless communications from antenna 140D on the second package substrate 1102. The short distance between the antennas allow for a low power and low noise connection between the two chips. The wireless interconnect reduces the complexity of the socket and the complexity of the motherboard for the computing platform. The antennas 140 illustrated in FIG. 1A are represented as a single component, however, it is to be appreciated that in some embodiments each antenna 140 may comprise a receive antenna and a transmit antenna.

While different frequencies may be used to suit particular implementations, embodiments of the invention may include millimeter wave and sub-THz frequencies. In one embodiment, the wireless communications may be in the 100-140 GHz band. The use of millimeter wave frequencies and the close proximity of the transmitting and receiving antennas 140, allow for an antenna that is small enough to be integrated on the same package that is normally used for the chip. Furthermore, the antennas may also be constructed using the same materials and processes that are used in the fabrication of the package substrates 110 (e.g., the materials and processing used to form alternating layers of conductive material for interconnect lines and dielectric layers, and vias formed through the dielectric layers) and still exhibit good electrical performance.

Referring now to FIG. 1B, a cross-sectional illustration of a processing unit 120 formed on a package substrate 110 is shown according to an embodiment. As illustrated, the processing unit 120 is coupled to the packaging substrate by solder bumps 122. In an embodiment, the processing unit 120 may be flip-chip bonded onto the packaging substrate 110. Additionally, an integrated heat spreader (IHS) 128 may be formed over the processing unit 120. The IHS 128 may be any thermally conductive material, such as copper. The IHS 128 may also include anticorrosive coatings such as, for example, nickel. In the illustrated embodiment, the IHS 128 is formed in contact with the backside of the processing unit 120 and the sidewalls of the processing unit 120, though embodiments are not limited to such configurations. According to an additional embodiment, the IHS 128 may contact only portions of the top surface of the processing unit 120, and the IHS 128 does not directly contact the sidewalls of the processing unit 120. Additional embodiments may include forming a thermal interface material (TIM) between the IHS 128 and the processing unit 120. The IHS 128 may be mounted to the substrate 110 with a sealant 129. Embodiments of the invention may include a sealant 129 that is conformal and provides an adhesive connection between the substrate 110 and the IHS 128. In one embodiment the sealant 129 may include silicone.

FIG. 1B also provides an illustration of an RFIC 130 and an antenna 140. In an embodiment, the antenna 140 may be integrated into the substrate 110. According to an embodiment, the RFIC 130 may be flip-chip bonded to the substrate with solder bumps 132. Since the performance of the RFIC 130 varies with temperature, the RFIC 130 may be mounted a distance S away from the processing unit 120 to ensure that the thermal energy produced by the processing unit 120 is sufficiently dissipated before reaching the RFIC 130. In an embodiment, the distance S may need to be greater than the minimum spacing between components allowed by assembly rules. For example, in order to provide sufficient heat dissipation, the spacing S may need to be approximately three to five times larger than the minimum spacing that the assembly rules allow. In one embodiment, the spacing S may be greater than 500 μm. Additional embodiments may include a spacing S that is between approximately 750 μm and 1250 μm.

While the use of wireless communications such as those described herein may increase the data transmission rates, power dissipation also becomes an issue, as described above. In order to further decrease the real estate required for the use of antennas, the distance S between the processing unit and the RFIC may be decreased when the RFIC is decoupled from the package substrate. Such embodiments are illustrated in FIGS. 2A-2C.

Referring now to FIG. 2A, embodiments of the invention include an RFIC module 260 that allows for reduction in the heat transfer to the RFIC 230. In embodiments, the operating temperature of the RFIC 230 is able to be maintained at a moderate temperature and the power of the RFIC 230 is maintained consistent. In one embodiment, decoupling the RFIC 230 from the package substrate 110 allows for the operating temperature of the RFIC 230 to be maintained at approximately 100° C. or less. In an additional embodiment, the operating temperature of the RFIC 230 may be maintained at approximately 70° C. or below. The device 200 illustrated in FIG. 2A is substantially similar to the device 100 illustrated in FIG. 1B, with the exception that the RFIC 230 and the antenna 240 are not directly attached to or incorporated into the package substrate 210. Instead, the RFIC 230 and antenna 240 may be incorporated into an RFIC module 260.

The RFIC module 260 may include an RFIC 230 and an antenna 240 that are communicatively coupled to each other through a module substrate 250. While a single RFIC 230 and a single antenna 240 are illustrated in the cross-sectional illustration provided in FIG. 2A, it is to be appreciated that two or more RFICs 230 and antennas 240 may be formed on each module 260. Additionally, embodiments include mounting a plurality of modules 260 on the package substrate 210. According to an embodiment, the RFIC 230 may be flip-chip bonded to a first surface of the module substrate 250 that faces the package substrate 210, and the antenna 240 may be formed into the module substrate 250. The RFIC 230 and the antenna 240 may be communicatively coupled to each other by conductive traces and vias (not shown) that are formed through the layers in the module substrate 250. The RFIC module 260 may be flip-chip bonded to the substrate 210, for example, with solder bumps 252. According to an additional embodiment, an underfill material (not shown) may be formed around the solder bumps 252 and below the RFIC module 260.

Forming the RFIC 230 and the antenna 240 on the module substrate has several advantages over a device with an RFIC that is mounted directly to the substrate 210. For example, the RFIC 230 is no longer in direct contact with the substrate 210, and the heat transfer from the CPU 220 to the RFIC 230 is reduced because there is no longer a direct thermal path between the CPU 220 and the RFIC 230. As illustrated, the RFIC 230 is separated from the substrate 210 by a spacing H. According to an embodiment the spacing H may be increased or decreased to provide the desired separation from the substrate 210. For example, the spacing H may be increased by increasing the thickness of the solder bumps 252 that couple the module substrate 250 to the substrate 210 and/or decreasing the thickness of the solder bumps 232 that couple the RFIC 230 to the module substrate 250. Additional embodiments may include forming a cavity (not shown) into the substrate 210 below the RFIC 230 to further increase the spacing H. For example, the spacing H may be between approximately 0 μm and 500 μm.

Embodiments that include an RFIC module 260, such as the one illustrated in FIG. 2A, may also benefit from a reduced footprint. As noted above, the temperature dependence of the RFIC requires that the RFIC 230 be spaced a distance S away from the processing unit 220 to allow for reduced heat transfer to the RFIC. However, when the RFIC is removed from the surface of the substrate 210, the spacing S may be reduced and the dimensions of the package may be reduced. In an embodiment, the spacing S may be approximately equal to the minimum spacing allowed by the assembly rules. In one embodiment, the spacing S may be approximately 250 μm. Furthermore, the dimensions of the package 200 may be reduced since the antenna 240 may be formed over the RFIC 230. Instead of the side-by-side arrangement illustrated in FIG. 1B, the RFIC 230 and the antenna 240 may be stacked in the Z-direction.

Furthermore, it is to be appreciated that the increased interconnect length through the RFIC module 260 in order to send signals between the RFIC 230 and the processing unit 220 does not create signal reliability issues. For example, when mm-wave communications are used, the circuitry to up-convert a baseband signal or down-convert a signal back into a baseband signal may be located only in the RFIC 230. As such, the data that needs to be transmitted between the RFIC 230 and the processing unit 220 may only comprise low-frequency baseband signals that have relaxed design rules.

In addition to the reduction in the dimensions of the package 200 available when an RFIC module 260 is used, the reconfigurablity of the package is also increased. The flip chip bonding of the RFIC module 260 allows for easy replacement of damaged components or for replacement with more advanced (e.g., faster, smaller, more robust, etc.) components when needed. For example, forming the antenna 240 in the module substrate 250 instead of the substrate 210 allows for easy replacement of the antenna 240. Previously, the entire substrate 210 and all of the components on the substrate 210 would need to be disassembled to replace the antenna, whereas embodiments of the invention may simply replace the RFIC module 260.

Embodiments of the invention may also utilize RFIC modules 260 with alternative configurations to the one illustrated in FIG. 2A. In one embodiment, the RFIC module 260 may include an RFIC 230 that is flip-chip bonded to a second surface of the module substrate 250 that faces away from the package substrate 210, as illustrated in FIG. 2B. Mounting the RFIC 230 to the second surface of the module substrate 250 may further increase the spacing H between the RFIC 230 and the substrate 210. Additionally, the RFIC 230 may be easier to access when it is located on the second surface of the module substrate 250 that faces away from the package substrate 210. As such, replacing or upgrading the RFIC 230 may be easier than if the RFIC 230 was mounted on the first surface of the module substrate 250.

According to an additional embodiment, an RFIC module 260 may further include an embedded RFIC 230. Such an embodiment is illustrated in FIG. 2C. The use of an embedded RFIC 230 allows for an increase in the spacing H compared to the spacing H that is obtainable with an RFIC 230 that is flip-chip bonded to the bottom surface of the module substrate 250. Additionally, the use of an embedded RFIC 230 allows for the RFIC 230 and the antenna 240 to be stacked in the Z-direction, and therefore, allows for a reduction in the size of the RFIC module 260.

According to an additional embodiment of the invention, the heat transfer from the processing unit through the substrate to the RFIC may be reduced by increasing the rate that thermal energy is dissipated prior to reaching the RFIC. A device according to such an embodiment is illustrated in the plan view illustration in FIG. 3A.

In FIG. 3A, the processing unit 320 is illustrated with a dashed line to indicate that it is formed below an IHS 328. The IHS 328 may be any suitable IHS 328 known to those skilled in the art. In an embodiment, the IHS 328 may be bonded to the substrate 310 with a sealant 329 (not visible in FIG. 3A). According to an embodiment, the processing unit 320 may be communicatively coupled to the RFIC 330 by conductive traces 335. In an embodiment, the conductive traces 335 may be suitable traces for transmitting baseband signals from the processing unit 320 to the RFIC 330. For example, the traces 335 may be copper traces or the like. According to an embodiment, the RFIC 330 may be communicatively coupled to the antenna 340 through conductive lines (not shown) that are formed in and/or over the substrate 310.

As illustrated in FIG. 3A, the device 300 includes a plurality of cooling spots 370 formed across the surface of the substrate 310. According to an embodiment, the cooling spots 370 are formed with a material that has a higher thermal conductivity than the substrate 310. In an embodiment, the cooling spots 370 are formed with the same material used to form the conductive traces 335 in the package substrate 310. By way of example, the cooling spots 370 may be a conductive material, such as copper. Due to the higher thermal conductivity, the exposed cooling spots 370 allow for more thermal energy to be dissipated than would be dissipated by the substrate 310. Since more thermal energy is dissipated by the cooling spots 370, the RFIC 330 may be spaced a distance from the processing unit 320 by a spacing S that is less than the spacing otherwise needed to maintain stable operating conditions in the RFIC 330.

In addition to being exposed to the surface, the cooling spots 370 may extend down into the substrate 310 in order to further increase the thermal dissipation provided by the cooling spots 370. According to an embodiment, the cooling spots 370 may include one or more pads 371 and one or more vias 372, which are visible in the cross-sectional illustration of FIG. 3B. The pads 371 and the vias 372 may be formed at the same time and with the same processing operations used to form other conductive features in the package substrate 310, such as conductive traces 380 and vias that connect conductive traces 380 between layers. Accordingly, the inclusion of cooling spots 370 does not significantly increase the complexity of fabricating the package substrate 310. It is to be appreciated that the device 300 illustrated in FIG. 3B has been simplified in order to not unnecessarily obscure the invention. For example, FIG. 3B has been simplified by reducing the number of cooling spots 370 shown, and embodiments are not limited to the number and configuration of cooling spots 370 illustrated in FIGS. 3A and 3B.

According to an embodiment, the cooling spots 370 may be formed one or more layers into the package substrate 310. For example, the cooling spots 370 may include only a pad 371 on the surface of the package substrate 310, and the cooling sports 370 may also include alternating pads 371 and vias 372 that extend all the way through the substrate 310. When the package substrate 310 includes a core (not shown) the cooling spots 370 may extend from the top surface of the package substrate 310 to the core. In some embodiments, the cooling spots 370 may not all be formed to the same depth into the substrate 310. For example, the cooling spots 370 may be formed deeper into the substrate 310 proximate to the antenna 340. Increasing the depth of the cooling spots 370 formed proximate to the antenna 340 may increase the possible bandwidth of the antenna, and therefore increase the rate of data transfer. For example, the cooling spots 370 proximate to the antenna 340 may be formed three layers into the substrate 310.

According to an embodiment, the thermal dissipation may be increased by increasing the size and/or the density of the cooling spots 370. For example, the size of the pads 371 and/or the width of the vias 372 may be increased, according to an embodiment. Additional embodiments may, however, have limitations to the size of the vias due to the limits of the drill size or other design rules. When the size of the cooling spots 370 are constrained, the density of the cooling spots 370 (i.e., the number of cooling spots per a given area) may be increased in order to increase thermal dissipation. Furthermore, while the cooling spots 370 are illustrated as being circular in the Figures, it is to be appreciated that embodiments are not limited to such configurations. For example, the cooling spots 370 may be any desired shape, such as, but not limited to, elliptical, rectangular, square, or any other polygon or rounded shape.

In an embodiment, the cooling spots 370 may be isolated (e.g., electrically and thermally) cooling spots 3701 or they may be grounded cooling spots 370G. The grounded cooling spots 370G may be electrically coupled to a ground plane 380G formed in the substrate 310. Grounding cooling spots 370 allows for the cooling spots 370G to further increase the electrical performance of the device 300 in addition to providing heat dissipation. For example, grounded cooling spots 370G inside dashed box 395 may be formed along the sides of the conductive traces 335 that couple the processing unit 320 to the RFIC 330. The rows of grounded cooling spots 370G formed around the conductive traces 335 produce a grounded-coplanar-waveguide (GCPW) structure. The presence of a GCPW structure allows for the impedance of the conductive traces 335 to be reduced compared to a microstrip. In an embodiment, the impedance may be adjusted by increasing or decreasing the distance between the cooling spots 370 and the conductive traces 335.

According to an additional embodiment, the thermal dissipation of the device may be further reduced by including an IHS over and/or around the RFIC. A plan view illustration and a partial cross-sectional view of a device according to such an embodiment is illustrated in FIGS. 4A and 4B.

In FIG. 4A, the device 400 is substantially similar to the device 300 described above, except that an IHS 485 is formed around the RFIC 430. According to an embodiment, the IHS 485 may be formed of a thermally conductive material, such as copper. According to additional embodiments, the IHS 485 may also include an anticorrosive layer, such as a nickel layer.

As illustrated in the cross-sectional view in FIG. 4B, embodiments may include an IHS 485 that is formed around the perimeter of the RFIC 430 and in contact with one or more of cooling spots 470. The contact between the IHS 485 and the cooling spots 470 provides an even greater amount of thermal dissipation. According to an embodiment, a thermal interface material (TIM) 482 may also be formed between the cooling spots 470 and the IHS 485 in order to further increase the heat transfer from the cooling spots 470 to the IHS 485. In addition to being placed between the cooling spots 470 and the IHS 485, the TIM 482 may also be formed along the sidewall of the RFIC 430 and connect to the IHS 485. Embodiments with this configuration may allow for thermal energy to dissipate from the RFIC 430 into the IHS 485 as well, thereby further lowering the temperature of the RFIC 430. Embodiments of the invention may also include portions of the IHS 485 that are secured to the substrate 470 by a sealant (not shown).

Additional embodiments of the invention may further include an IHS 485 that contacts a top surface of the RFIC 430 as well. Such an embodiment is illustrated in FIG. 4C. The device 400 illustrated in FIG. 4C is substantially similar to the device illustrated in FIG. 4B, with the exception that the IHS 485 covers the entire RFIC 430. According to an embodiment, a TIM 482 may also be formed between the IHS 485 and the top surface of the RFIC 430.

In addition to having an IHS 485 formed over and/or around the RFIC 430, heat transfer away from the RFIC may be increased by using a heat sink that is coupled to the IHS 485 as well. Such an embodiment is illustrated in the cross-sectional illustration of a device in FIG. 5A.

Referring now to FIG. 5A, the device 500 includes a heat sink 590 that is formed over the top surface of the IHS 528 over the processing unit 520 and over the top surface of the IHS 585 over the RFIC 530. The heat sink 590 should be substantially parallel to the surface of the motherboard when it is mounted to the surfaces. However, it is to be appreciated that the stand-off heights of the processing unit IHS 528 and the RFIC IHS 585 may be different. Accordingly, the heat sink 590 may have a non-uniform thickness to accommodate to the differences in height. For example, in the illustrated embodiment, the heat sink 590 may have a first thickness T1 that is over the processing unit IHS 528 and a second thickness T2 that is over the RFIC IHS 585.

In an additional embodiment illustrated in FIG. 5B, the heat sink 590 may have a single thickness and the thickness of one or both IHS may be altered to ensure the stand-off heights are substantially equal. For example, in FIG. 5B, the thickness of the RFIC IHS 585 is increased so that the stand-off heights of the processing unit IHS 528 and the RFIC IHS 585 are substantially equal.

According to an additional embodiment illustrated in FIG. 5C, two separate heat sinks 591 and 592 may be mounted to the processing unit IHS 528 and the RFIC IHS 585, respectively. However, it is to be appreciated that a second heat sink 592 may optionally be omitted, and a single heat sink 591 may be formed over only one of the processing unit IHS 585 and the RFIC IHS 585.

Figure 6:
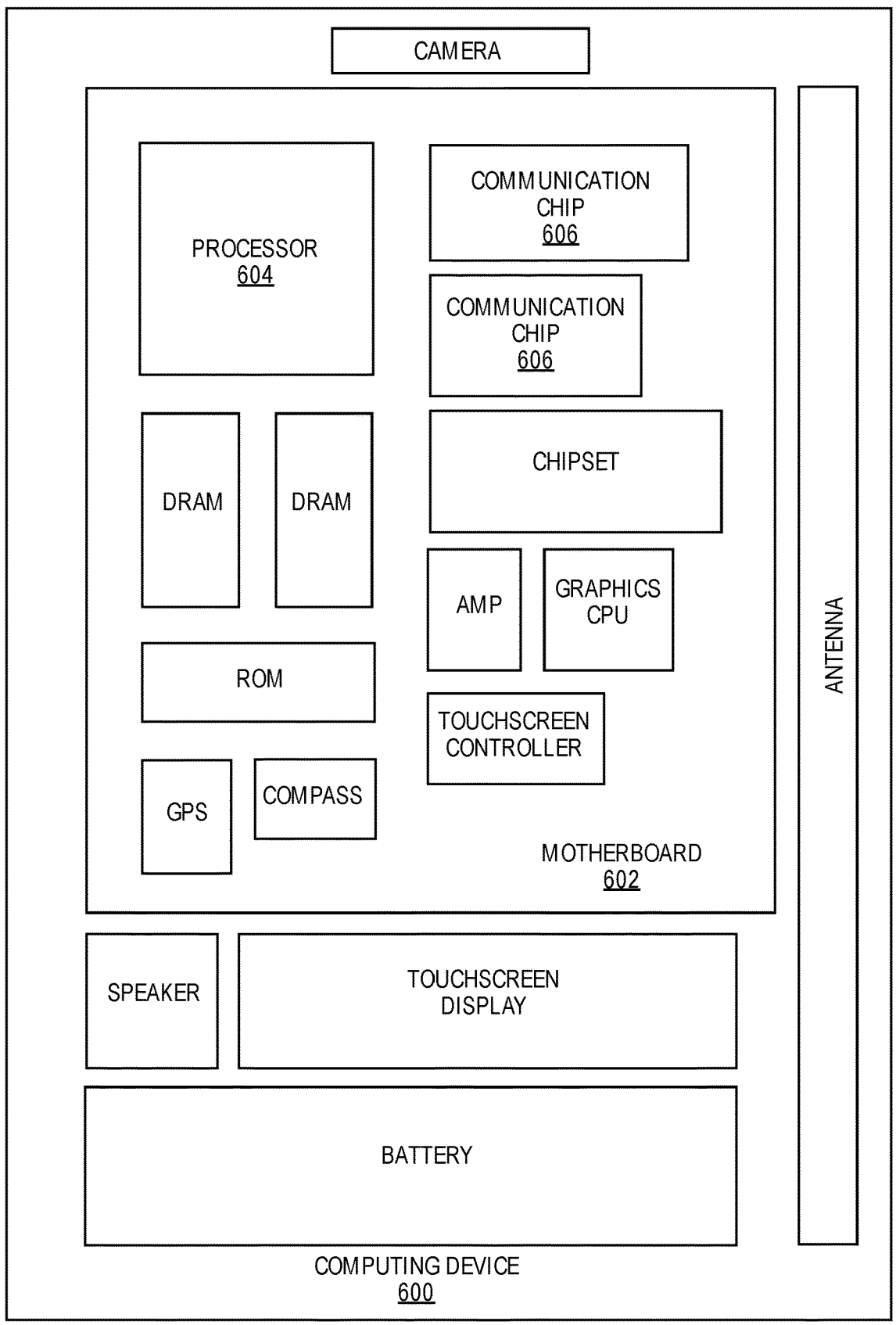
FIG. 6 is an illustration of a schematic block diagram of a computer system that utilizes a semiconductor package, according to an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die may be packaged with one or more devices on a package substrate that includes a thermally stable RFIC and antenna for use with wireless communications, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged with one or more devices on a package substrate that includes a thermally stable RFIC and antenna for use with wireless communications, in accordance with implementations of the invention.

The following examples pertain to further embodiments. The various features of the different embodiments may be variously combined with some features included and others excluded to suit a variety of different applications.

Some embodiments pertain to a packaged device comprising: an integrated circuit chip; a package substrate to carry the integrated circuit chip, the package substrate having conductive lines to communicatively couple the integrated circuit chip to one or more external components; and a radio frequency integrated circuit (RFIC) module communicatively coupled to the integrated circuit chip, wherein the RFIC module comprises: a radio frequency integrated circuit (RFIC) coupled to the RFIC module; and an antenna communicatively coupled to the RFIC to send data to an external device.

Additional embodiments of the invention may include a packaged device Additional embodiments of the invention may include a packaged device, wherein the RFIC is flip-chip mounted to the RFIC module.

Additional embodiments of the invention may include a packaged device, wherein the RFIC is mounted to a first surface of the RFIC module that faces towards the package substrate and is between the RFIC module and a surface of the package substrate.

Additional embodiments of the invention may include a packaged device, wherein the antenna is embedded in the RFIC module and is located above the RFIC.

Additional embodiments of the invention may include a packaged device, wherein the RFIC is mounted to a second surface of the RFIC module that faces away from the package substrate.

Additional embodiments of the invention may include a packaged device, wherein the RFIC is embedded within the RFIC module.

Additional embodiments of the invention may include a packaged device, wherein the antenna is embedded within the RFIC module.

Additional embodiments of the invention may include a packaged device, wherein the RFIC module is flip-chip mounted to the package substrate.

Some additional embodiments of the invention may include a packaged device that comprises: an integrated circuit chip; a package substrate to carry the integrated circuit chip, the package substrate having conductive lines to communicatively couple the integrated circuit chip to one or more external components; a radio frequency integrated circuit (RFIC) communicatively coupled to the integrated circuit chip by one or more of the conductive lines; an antenna communicatively coupled to the RFIC to send data to an external device; and a plurality of cooling spots formed into the package substrate.

Additional embodiments of the invention may include a packaged device, wherein one or more of the plurality of cooling spots are formed between the conductive lines.

Additional embodiments of the invention may include a packaged device, wherein the one or more cooling spots formed between the conductive lines are electrically coupled to a ground plane formed in the package substrate.

Additional embodiments of the invention may include a packaged device, wherein the one or more grounded cooling spots and the conductive lines form a grounded-coplanar-waveguide (GCPW) structure.

Additional embodiments of the invention may include a packaged device, wherein the cooling spots comprise a pad exposed on the surface of the package substrate and one or more vias that extend through one or more layers of the package substrate.

Additional embodiments of the invention may include a packaged device, wherein a first set of cooling spots proximate to the antenna extend through more layers of the package substrate than a second set of cooling spots proximate to the RFIC.

Additional embodiments of the invention may include a packaged device, wherein the first set of cooling spots are electrically isolated cooling spots.

Additional embodiments of the invention may include a packaged device, that further comprises: an integrated heat spreader (IHS) formed around the RFIC and in thermal communication with one or more cooling spots.

Additional embodiments of the invention may include a packaged device, wherein the IHS is coupled to the one or more cooling spots with a thermal interface material (TIM).

Additional embodiments of the invention may include a packaged device, wherein the TIM also thermally couples the RFIC to the IHS.

Additional embodiments of the invention may include a packaged device, wherein the IHS is in thermal communication with a top surface of the RFIC.

Additional embodiments of the invention may include a packaged device that further comprises: a heat sink coupled to the IHS.

Additional embodiments of the invention may include a packaged device, wherein the heat sink is also coupled to the integrated circuit chip.

Additional embodiments of the invention may include a packaged device, wherein the heat sink has a first thickness over the integrated circuit chip and a second thickness over the RFIC.

Some additional embodiments of the invention may include a packaged device that comprises: an integrated circuit chip; a package substrate to carry the integrated circuit chip, the package substrate having conductive lines to communicatively couple the integrated circuit chip to one or more external components; a radio frequency integrated circuit (RFIC) module communicatively coupled to the integrated circuit chip, wherein the RFIC module comprises: a radio frequency integrated circuit (RFIC) coupled to the RFIC module; and an antenna communicatively coupled to the RFIC to send data to an external device; and a plurality of cooling spots formed into the package substrate.

Additional embodiments of the invention may include a packaged device, wherein one or more of the plurality of cooling spots are formed between the conductive lines.

Additional embodiments of the invention may include a packaged device, wherein the one or more cooling spots formed between the conductive lines are electrically coupled to a ground plane formed in the package substrate, and wherein the one or more grounded cooling spots and the conductive lines form a grounded-coplanar-waveguide (GCPW) structure.

What is claimed is:
1. A server platform, comprising:
   a board;
   a first processing module on a first package substrate attached to the board, wherein the first processing module comprises:
      a first integrated circuit (IC);
      a first radio frequency integrated circuit (RFIC) communicatively coupled to the first IC by traces on the first package substrate;
      a first antenna; and
      a first plurality of cooling spots in the first package substrate; and a second processing module on a second package substrate attached to the board, wherein the second processing module comprises:
a second IC;
a second RFIC communicatively coupled to the second IC by traces on the second package substrate;
a second antenna; and
a second plurality of cooling spots in the second package substrate, wherein the first antenna and the second antenna are configured to communicate with each other.

2. The server platform of claim 1, wherein the first IC and the second IC are the same components.

3. The server platform of claim 2, wherein the first IC and the second IC are server central processing units (CPUs).

4. The server platform of claim 3, wherein the first IC and the second IC are different components.

5. The server platform of claim 4, wherein the first IC is a central processing unit (CPU) and the second IC is a memory component.

6. The server platform of claim 1, wherein a first set of cooling spots extend through more layers of the first package substrate than a second set of cooling spots.

7. The server platform of claim 1, wherein one or more of the first plurality of cooling spots are formed between conductive lines formed in the first package substrate.

8. The server platform of claim 7, wherein the one or more cooling spots formed between the conductive lines are electrically coupled to a ground plane formed in the package substrate.

9. The server platform of claim 8, wherein the one or more cooling spots and the conductive lines form a grounded-coplanar-waveguide (GCPW) structure.

10. The server platform of claim 1, wherein the antennas are millimeter wave antennas.

11. A packaged device, comprising:
an integrated circuit chip;
a package substrate to carry the integrated circuit chip, the package substrate having conductive lines to communicatively couple the integrated circuit chip to one or more external components;
a radio frequency integrated circuit (RFIC) communicatively coupled to the integrated circuit chip by one or more of the conductive lines;
an antenna communicatively coupled to the RFIC, wherein the antenna contacts the package substrate; and
a plurality of cooling spots formed into the package substrate, wherein a first set of cooling spots extend through more layers of the package substrate than a second set of cooling spots.

12. The packaged device of claim 11, wherein the first set of cooling spots are proximate to the RFIC and the second set of cooling spots are proximate to the antenna.

13. The packaged device of claim 11, wherein one or more of the plurality of cooling spots are formed between the conductive lines.

14. The packaged device of claim 13, wherein the one or more cooling spots formed between the conductive lines are electrically coupled to a ground plane formed in the package substrate.

15. The packaged device of claim 11, wherein the one or more cooling spots and the conductive lines form a grounded-coplanar-waveguide (GCPW) structure.

16. The packaged device of claim 11, wherein the cooling spots comprise a pad exposed on the surface of the package substrate and one or more vias that extend through one or more layers of the package substrate.

17. The packaged device of claim 16, wherein the first set of cooling spots are electrically isolated cooling spots.

18. The packaged device of claim 11, further comprising:
an integrated heat spreader (IHS) formed around the RFIC and in thermal communication with one or more cooling spots.

19. The packaged device of claim 18, wherein the IHS is coupled to the one or more cooling spots with a thermal interface material (TIM).

20. The packaged device of claim 19, wherein the TIM also thermally couples the RFIC to the IHS.

* * * * *